(12) United States Patent
Mauder et al.

(10) Patent No.: US 8,193,584 B2
(45) Date of Patent: Jun. 5, 2012

(54) SEMICONDUCTOR COMPONENT INCLUDING A DRIFT ZONE AND A DRIFT CONTROL ZONE

(75) Inventors: Anton Mauder, Kolbermoor (DE); Stefan Sedlmaier, Munich (DE); Armin Willmeroth, Augsburg (DE)

(73) Assignee: Infineon Technologies Austria AG, Villach (AT)

( * ) Notice: Subject to any disclaimer, the term of this patent is extended or adjusted under 35 U.S.C. 154(b) by 396 days.

(21) Appl. No.: 12/164,630

(22) Filed: Jun. 30, 2008

(65) Prior Publication Data

US 2009/0321804 A1    Dec. 31, 2009

(51) Int. Cl.
*H01L 29/76* (2006.01)

(52) U.S. Cl. .......................... 257/341; 257/135; 257/300

(58) Field of Classification Search .................. 257/135, 257/300, 341
See application file for complete search history.

(56) References Cited

U.S. PATENT DOCUMENTS

| 2006/0012310 A1* | 1/2006 | Chen et al. ................. 315/169.3 |
| 2007/0023830 A1* | 2/2007 | Pfirsch et al. ................ 257/341 |
| 2007/0085136 A1* | 4/2007 | Krumrey et al. .............. 257/330 |

* cited by examiner

*Primary Examiner* — Howard Weiss
*Assistant Examiner* — Tifney Skyles
(74) *Attorney, Agent, or Firm* — Dicke, Billig & Czaja, PLLC

(57) ABSTRACT

A semiconductor component including a drift zone and a drift control zone. One embodiment provides a transistor component having a drift zone, a body zone, a source zone and a drain zone. The drift zone is arranged between the body zone and the drain zone. The body zone is arranged between the source zone and the drift zone.

5 Claims, 9 Drawing Sheets

A - A

A - A

SEMICONDUCTOR COMPONENT INCLUDING A DRIFT ZONE AND A DRIFT CONTROL ZONE

BACKGROUND

In semiconductor components including a drift zone and a drift control zone, when the component is driven in the on state, the drift control zone serves for controlling a conducting channel in the drift zone along a drift control zone dielectric arranged between the drift zone and the drift control zone. The conducting channel brings about a reduction of the on resistance of the component in comparison with such components which do not have a drift control zone.

Such a semiconductor component can be formed as a MOS transistor. In this case the component has, in addition to the drift zone and the drift control zone, a drain zone, a body zone, a source zone and a gate electrode. In this case, the drift zone is arranged between the drain zone and the body zone. The gate electrode serves for controlling a conducting channel in the body zone between the source zone and the drift zone.

The switching behavior of such a MOS transistor is determined by the gate-source capacitance of the transistor and the gate-drain capacitance of the transistor. This denotes parasitic capacitances between the gate electrode and the source zone, and between the gate electrode and the drain zone. A MOS transistor having a drift control zone has in the on state a significantly lower on resistivity (product of on resistance Ron and required chip area A) than a conventional MOS transistor. For the same on resistance as a conventional MOS transistor, such a MOS transistor having a drift control zone can thus be realized with a smaller space outlay, that is to say chip area requirement. When the chip area is reduced, the abovementioned capacitances that influence the switching behavior are also reduced in a corresponding manner. A reduction of the capacitances leads to a steepening of switching edges when the MOS transistor is switched on and off, that is to say to particularly steep edges of a current flowing through the transistor or of a voltage present across the transistor. This can lead to problems particularly when the MOS transistor is used for switching inductive loads without a freewheeling element or a freewheeling current branch being present, or when a load driven by the MOS transistor has large parasitic inductances. Rapid changes in a current flowing through the MOS transistor can lead to undesirable voltage spikes in the circuit overall and especially at the MOS transistor, the voltage spikes being brought about by the inductances.

SUMMARY

One embodiment provides a transistor component including a gate-source capacitance is formed between the gate electrode and the source zone. A gate-drain capacitance is formed between the gate electrode and the drain zone. At least one of the following components is provided: at least one first capacitive component connected between a gate electrode and a source zone in addition to the gate-source capacitance; at least one second capacitive component connected between the gate electrode and the drain zone in addition to the gate-drain capacitance.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

Figure 1:
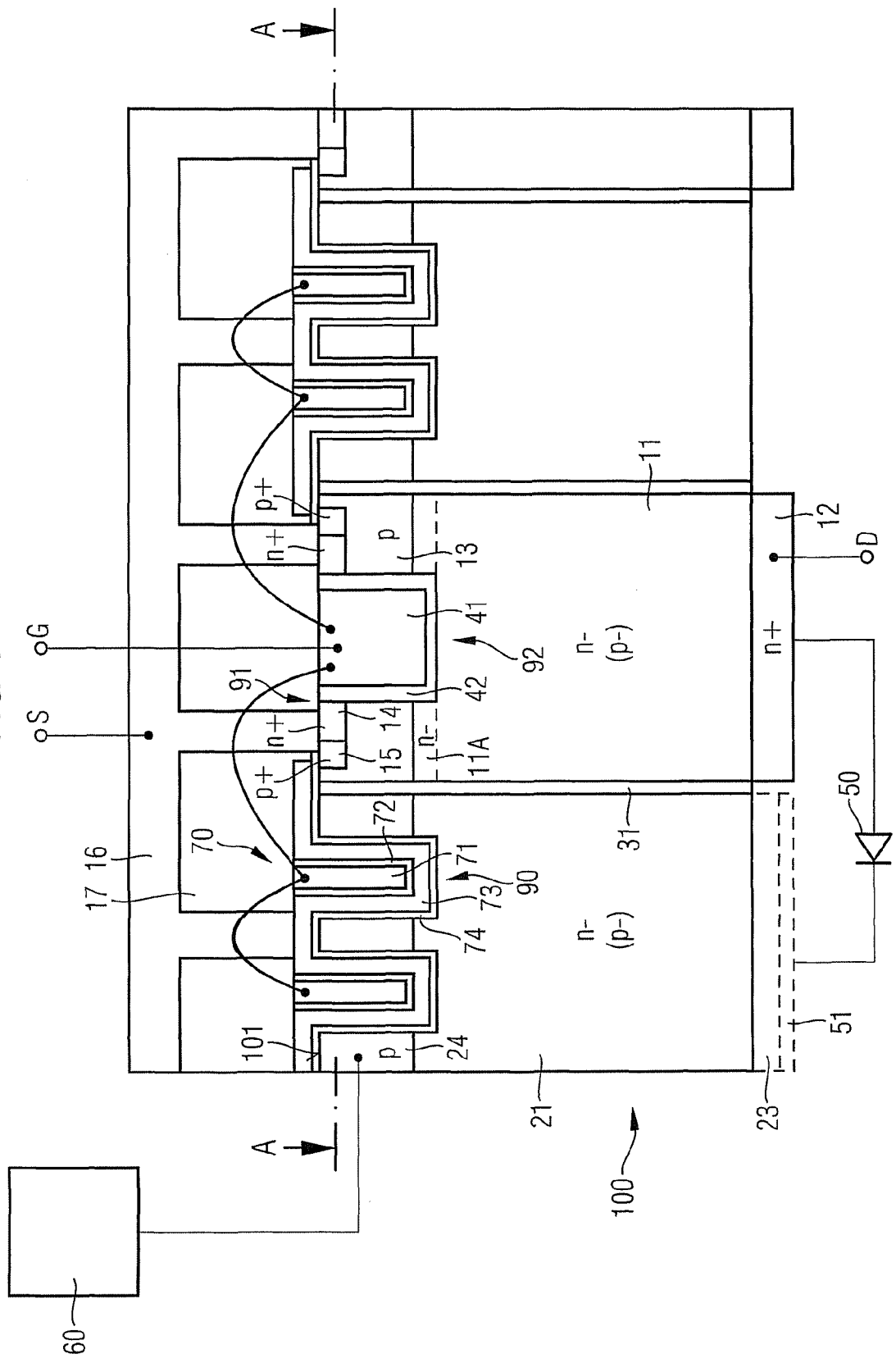
FIG. 1 illustrates, on the basis of a cross-sectional illustration, one embodiment of a transistor component including a drift zone and a drift control zone and a first capacitive component, which is connected between a gate electrode and a source zone.

FIG. 1 illustrates one embodiment of a transistor component on the basis of a cross-sectional illustration of a semiconductor body 100 with component regions of the transistor component arranged in the semiconductor body. The semiconductor body 100 is composed of silicon, for example, but can be composed of some other semiconductor material, such as e.g., gallium arsenide (GaAs) or silicon carbide (SiC).

The transistor component illustrated has a drift zone 11, a drain zone 12, a body zone 13 and a source zone 14. In this case, the drift zone 11 is arranged in the semiconductor body 100 between the drain zone 12 and the body zone 13. The body zone 13 is arranged between the source zone 14 and the drift zone 11, such that the body zone 13 separates the source zone 14 and the drift zone 11 from one another. In a manner that will be explained below, the drift zone 11 serves to take up a reverse voltage present across the component when the component is driven in the off state. Dimensions of the drift zone 11 in a current flow direction of the component and its doping concentration determine the dielectric strength of the component.

The component illustrated is formed as a MOS transistor component and has a gate electrode 41, which is dielectrically insulated from the body zone 13 by a gate dielectric 42. The gate electrode 41 extends adjacent to the body zone 13 from the source zone 14 as far as or right into the drift zone 11 and serves, in a manner that will be explained below, for controlling a conducting channel that extends in the body zone 13 from the source zone 14 as far as the drift zone 11. In this case, the gate electrode 41, the source zone 14 and a section of the gate dielectric 42 which is arranged between the gate electrode 41 and the source zone 14 form a gate-source capacitance 91—which is customary in MOS transistors. In this case, a capacitance value of the gate-source capacitance 91 is determined by the area over which the gate electrode 41 and the source zone 14 mutually overlap across the gate dielectric 42. For a given thickness of the dielectric 42, the gate-source capacitance 91 is in this case all the larger, the larger the area of overlap.

The component additionally has a gate-drain capacitance 92—which is customary in MOS transistors—formed by the gate electrode 41 and, in the example illustrated, by the drift zone 11 and also a section of the gate dielectric 42 which is arranged between the gate electrode 41 and the drift zone 11. A capacitance value of the gate-drain capacitance 92 is in this case determined by the area over which the gate electrode 41 and the drift zone 11 mutually overlap across the gate dielectric 42. For a given thickness of the gate dielectric 42, the gate-drain capacitance 91 is in this case all the larger, the larger the area of overlap. In this case, the thickness of the gate dielectric 42 can be at least approximately identical at every location, but the thickness of the gate dielectric can also vary.

Adjacent to the drift zone 11 is a drift control zone 21, which is dielectrically insulated from the drift zone 11 by a dielectric layer 31, which is referred to hereinafter as drift control zone dielectric, and which is composed of a monocrystalline semiconductor material, for example. The drift control zone is arranged adjacent to the drift zone 11 in a direction that differs from a current flow direction of the component. In this case, the current flow direction is the direction in which a current flows through the drift zone 11 when the component is driven in the on state.

The component illustrated in FIG. 1 is a vertical component. In this component, a current flow direction corresponds to a vertical direction of the semiconductor body 100. In this case, the vertical direction is a direction running perpendicular to a first side 101 of the semiconductor body 100, the first side also being referred to hereinafter as front side. In the example illustrated, the drift control zone 21 is arranged adjacent to the drift zone 11 in a direction perpendicular to the current flow direction, that is to say in a lateral direction of the semiconductor body 100 in the example illustrated. FIG. 1 illustrates a cross section in a vertical sectional plane, that is to say in a sectional plane which runs perpendicular to the front side 101 and in which the current flow direction runs. In the vertical transistor structure illustrated, the source zone 14, the body zone 13, the drift zone 11 and the drain zone 12 are arranged adjacent to one another in a vertical direction of the semiconductor body 100. It should be pointed out that the component is of course not restricted, however, to being realized as a vertical component.

Contact is made with the source zone 14 by a source electrode 16. In the example illustrated, the source electrode 16 additionally makes contact with the body zone 13 and thereby short-circuits the source zone 14 and the body zone 13. For the low-resistance connection of the source electrode 16 to the body zone 13, a connection zone 15 of the same conduction type as the body zone 13 and doped more highly than the body zone 13 can be provided, the connection zone being arranged between the source electrode 16 and the body zone 13.

The transistor structure illustrated for elucidation purposes in FIG. 1 is a structure of a normally off MOSFET. In this case, the source zone 14 and the body zone 13 are doped complementarily to one another, and the drain zone 12 is of the same conduction type as the source zone 14 and therefore doped complementarily to the body zone 13. The drift zone 11 is of the same conduction type as the source zone 14 and the drain zone 12, but can also be doped complementarily to the source zone 14 and the drain zone 12 or can be intrinsic. The drift control zone 21 can be of the same conduction type as the drift zone 11, but can also be doped complementarily to the drift zone 11 or be intrinsic. In this component, the gate electrode 41 serves for controlling an inversion channel in the body zone 13 between the source zone 14 and the drift zone 11. However, the concept discussed in the present description can of course also be applied to normally on transistors. In this case (not illustrated more specifically), the body zone 13 or only that region of the body zone 13 which adjoins the gate dielectric 42 is of the same conduction type as the source zone 14.

The transistor structure illustrated for elucidation purposes in FIG. 1 is a structure of an n-conducting component. In this case, the source zone 14 is n-doped, while the body zone 13 is p-doped. The channel controlled by the gate electrode 41 in the body zone 13 in this component is an n-channel or electron channel. It goes without saying that the component can also be realized as a p-conducting component. The doping types indicated for elucidation purposes in FIG. 1 should then be interchanged.

Figure 11:
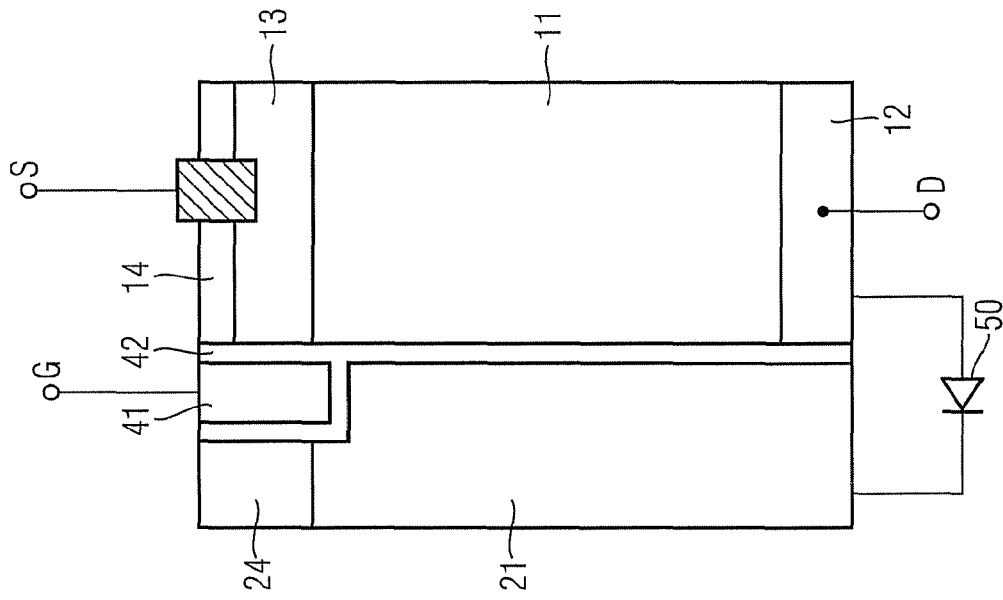
FIG. 11 schematically illustrates one embodiment of a transistor component realized as a planar transistor component.

The transistor structure illustrated in FIG. 1 is a trench transistor structure. In this case, the gate electrode 41 extends into the semiconductor body 100 in the vertical direction proceeding from the front side 101 and reaches through the source zone 14 and the body zone 13 right into or at least as far as the drift zone 11. In this case, the gate electrode 41 is insulated from the aforementioned component zones by the gate dielectric 42. It should be pointed out that the MOSFET structure illustrated should be understood merely as an example and was chosen for elucidation purposes. It goes without saying that any other MOSFET structures can be used, for example, those that will be explained with reference to FIGS. 11 and 12.

In FIG. 1, the reference symbols D, S and G designate drain, source and gate connections of the component, which are merely illustrated schematically.

The drift control zone 21 can be connected to the drain zone 12 via a rectifier element 50. The rectifier element 50 is a bipolar diode, for example, and is merely illustrated schematically by an electrical circuit symbol in FIG. 1. The rectifier element can be realized in any desired manner; by way of example, it can be integrated in the semiconductor body 100 but can also be realized as an external component. Instead of a bipolar diode, for example, a Schottky diode is also suitable as the rectifier element.

The rectifier element 50 can be electrically connected to the drift control zone 21 via a more highly doped connection zone 23 (illustrated by dashed lines). In this case, the doping species of the connection zone 23 depends on the type of transistor and is a donor doping (n-type doping) for an n-conducting component. In this case, the connection zone 23 and/or a contact electrode 51 (likewise illustrated by dashed lines) arranged between the drift control zone 21 and the rectifier element 50 can be embodied over the whole area, that is to say over the entire area of the drift control zone in the region of the rear side of the semiconductor body 100, or else just locally. The regions of the connection zone 23 which are not connected to a contact electrode 51 can be covered with an insulator layer (not illustrated).

In the component illustrated in FIG. 1, the rectifier element makes contact with the connection zone 23 in the region of the rear side of the semiconductor body 100. In a manner not illustrated more specifically, there is also the possibility of leading the connection zone 22 as far as the front side, and of connecting the rectifier element 50 to the connection zone in the region of the front side 101—optionally via a contact electrode.

The semiconductor component likewise has to reduce the reverse voltage in a lateral direction at its boundaries. A large selection of known edge terminations are available for this purpose, such as field plate edges, field ring edges, edge terminations based on a lateral variation of the doping at the surface, and a combination of the aforementioned principles. Such an edge termination is not illustrated in the Figures. It suffices to extend the drift control zone 21 in a direction of the plane of the drawing through as far as below such an edge termination. Drain potential is present outside the edge termination, that is to say that there is no space charge zone present in these regions in the semiconductor body and also near the front side 101 in the off-state case, such that the rectifier element 50 can be connected to a contact electrode, near the surface, of the drift control zone 21.

The rectifier element 50 is connected up in such a way that it prevents a potential equalization between an electrical potential of the drift control zone 21 and an electrical potential of the drain zone 12 when the component is driven in the on state. The rectifier element 50 makes it possible, when the component is driven in the on state, for the drift control zone 21 to assume an electrical potential that differs from the electrical potential of the drain zone 12 or the drift zone 11 in such a way that a conducting channel can form in the drift zone 11—under the control of the drift control zone 21—along the drift control zone dielectric 31. In the n-conducting component illustrated in FIG. 1, in this case the electrical potential of the drift control zone 21 when the component is driven in the on state lies above the drain potential and the conducting channel along the drift control zone dielectric 31 is an accumulation channel. In the case of a p-channel MOSFET (not illustrated), in which the doping types of the individual component zones are complementary to the doping types illustrated in FIG. 1, the electrical potential of the drift control zone with the component driven in the on state is below the drain potential. The polarity of the rectifier element should then be reversed in comparison with the rectifier element in accordance with FIG. 1.

The dielectric strength of the rectifier element 50 is chosen for example, such that the reverse voltage of the rectifier element is higher than the potential differences that occur during normal operation between the drift control zone 21 and the drift zone 11 and respectively the drain zone 12 if the component has been driven in the on state. The dielectric strength is between 10 V and 100 V, for example. To summarize, the rectifier element prevents the drift control zone 21 from being discharged in a direction of the drain zone 12 when the component is driven in the on state, provided that the potential difference between the drift control zone 21 and the drain zone 12 does not exceed the breakdown voltage of the rectifier element 50.

When the component is driven in the off state, the rectifier element 50 couples the drift control zone 21 to the drain zone 12 in terms of potential. The drift control zone 21 is realized in such a way that a space charge zone can propagate in the drift control zone 21—in the same way as in the drift zone 11—when the component is driven in the off state. For this purpose, the drift control zone 21 is composed of a monocrystalline semiconductor material, for example.

The basic functioning of the semiconductor component illustrated in FIG. 1 is explained below: the component illustrated is turned on if a voltage is present between the drain zone 12 and the source zone 14 and if there is present at the gate electrode 41 a drive potential suitable for forming an inversion channel in the body zone 13. In the case of the n-MOSFET illustrated, the voltage to be applied between drain and source D, S is a positive voltage and the drive potential of the gate electrode 41 is a positive potential with respect to source potential. When the component is driven in the on state, in static normal operation the drift control zone 21 is additionally charged to an electrical potential that lies above the electrical potential of the drain zone 12 and thus above the electrical potential of the drift zone 11. As a result of this, a conducting channel—an accumulation channel in the example—forms along the drift control zone dielectric 31 in the drift zone 11 and brings about a significant reduction of the on resistance of the illustrated component in comparison with a component which does not have such a drift control zone. In this case, the electrical potential in the drift control zone 21 lies for example, between approximately 10 V and 100 V above the electrical potential of the source zone. If, as e.g., in short circuit operation, a higher electrical potential is present at the drain zone 12 than at the drift control zone 21, then no or only a short accumulation channel forms in the drift zone 11.

Charge carriers required for charging the drift control zone 21 to an electrical potential that lies above the electrical potential of the drift zone 11 are provided by a charging circuit 60, which is connected to the drift control zone 21. A contact electrode (not illustrated) and a doped connection zone 24, with which contact is made by the contact electrode, may be present for the purpose of connecting the charging circuit 60 to the drift control zone 21. In this case, the connection zone 24 can be doped highly enough that an ohmic contact with the connection electrode is achieved. The conduction type of the connection zone 24 is chosen such that it is opposite to the conduction type of the component. In the case of an n-conducting component, therefore, the connection zone 24 is p-doped and vice versa. It should be noted in this connection that the conduction type of the component is determined by the doping type of the source zone 14. A connection of the charging circuit to the drift control zone 21 is only illustrated schematically in FIG. 1. This connection can be situated at any desired position of the semiconductor body 100 in the region of the front side 101.

The connection zone 24 is adjacent to the drift control zone 21 at an end which is opposite, in a vertical direction of the semiconductor body 100, to that end of the drift control zone at which the rectifier element 50 makes contact with the drift control zone 21. The connection zone 24 can be doped complementarily to the drift control zone 21 (as illustrated), but can also be of the same conduction type as the drift control zone 21. In the case of the n-MOSFET illustrated, a complementarily doped, that is to say in the example p-doped connection zone 24 provides for reducing the contact resistance between the drift control zone 21 and the connection electrode 53 and, in the on state, provides the holes that are required for forming the accumulation channel along the drift control zone dielectric 31 in the drift control zone 21. It should be pointed out in this connection that the drift control zone 21, contrary to the illustration of FIG. 1, can also be p-doped—and thus doped complementarily to the drift zone 11—or intrinsic.

The component illustrated in FIG. 1 is turned off when no or a positive voltage is present between drain D and source S and a drive potential suitable for forming an inversion channel in the body zone 13 is not present at the gate electrode 41. In this case, a space charge zone propagates in the drift zone 12 proceeding from the pn junction between the drift zone 11 and the body zone 13. In a manner corresponding to that in the drift zone 11, a space charge zone propagates in the drift control zone 21 when the component is turned off. These space charge zones propagating in the drift zone 11 and the drift control zone 21 limit the voltage difference between the drift zone 11 and the drift control zone 21 and thereby protect the drift control zone dielectric 31 against a voltage breakdown when the component is turned off.

The doping concentrations of the drift zone 11 and of the drift control zone 21 lie in the same range, for example. These doping concentrations depend for instance indirectly proportionally on the required blocking capability between drain 12 and source 14. They are approximately $1.4 \cdot 10^{14}$ cm$^{-3}$ or less, for example, in the case of a component having a blocking capability or dielectric strength of 600 V.

The component can be constructed in cellular fashion, that is to say can have a number of component structures of identical type, transistor cells, as is illustrated by dashed lines in FIG. 1. In this case, the individual transistor cells are connected in parallel by the gate electrodes 41 of the individual transistor cells being electrically conductively connected to one another, by the source zones 14 of the individual transistor cells being electrically conductively connected to one another and by the drain zones 12 of the individual transistor cells being conductively connected to one another. In the case of a component having the component structure illustrated in FIG. 1, two transistor cells respectively share a drift control zone 21. The component can have for example, thousands of such transistor cells connected in parallel.

Figure 2:
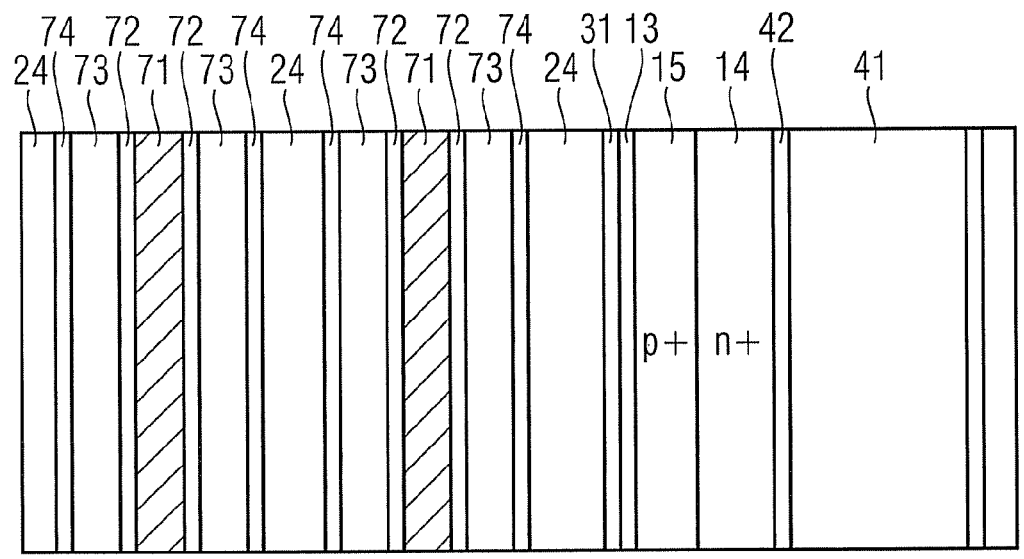
FIG. 2 illustrates, on the basis of a cross-sectional illustration, one embodiment of a realization of the transistor component with strip cells.

Referring to FIG. 2, which illustrates a cross section through the semiconductor body 100 in a section plane A-A illustrated in FIG. 1, the individual transistor cells can be formed in strip-shaped fashion; the component zones illustrated then extend in elongated fashion in a direction running perpendicular to the plane of the drawing illustrated in FIG. 1.

It goes without saying that any other transistor cell geometries can also be employed, such as, for example, rectangular, in one embodiment square, transistor cells, hexagonal transistor cells or any polygonal or round transistor cells.

On the other hand, any desired geometries of the drift control zones 21 which are followed by the geometry of the drift zone 11 and thus the geometry of the transistor cells are also conceivable. Thus, the drift control zones 21, referring to FIG. 2, which illustrates a section through the semiconductor body 100 in a sectional plane A-A, can be embodied in elongated fashion in a direction running perpendicular to the plane of the drawing or else as, for example, rectangular, in one embodiment square, hexagonal or arbitrarily polygonal or round structures.

The conductivity of the conducting channel which is controlled by the drift control zone 21 and is formed along the dielectric layer 31 in the drift zone 11 is determined by the thickness of the dielectric layer 31. In the example illustrated, the thickness of the dielectric layer 31 is the dimension thereof in a lateral direction of the semiconductor body. In the component illustrated in FIG. 1, the channel that is formed along the dielectric layer 31 is an accumulation channel, that is to say that electrons are accumulated along the dielectric layer 31 under the control of the electrical potential in the drift control zone 21. For a given potential of the drift control zone 21, the accumulation effect is all the more pronounced here, the thinner, or the smaller the thickness of, the dielectric layer 31 or the higher its dielectric constant. Any dielectric materials such as e.g., oxides or nitrides and also high-dielectric (high-k) materials are suitable as material for the dielectric layer 31. The thickness of the drift control zone dielectric 31 lies for example, in the range from a few tens to a few hundreds of nanometers (nm).

The switching behavior of the transistor component illustrated is influenced by the gate-source capacitance explained above. In a manner already explained, the gate electrode 41, for driving the component in the on state, has to be charged to an electrical potential that differs at least by the value of a threshold voltage from the source potential, that is to say the electrical potential of the source zone 14. The component is driven in the on state in this way for example, by using a drive circuit which is connected to the gate connection G—the drive circuit being known in principle and therefore not illustrated in more specific detail—and which provides a gate charging current for driving the component in the on state and a gate discharging current for driving the component in the off state. By using the gate charging current, the gate electrode 41 is charged to the drive potential explained for driving the component in the on state. In this case, the transition of the component from the off state to the on state is effected all the more rapidly, the smaller the capacitances that are to be subjected to charge reversal, that is to say in one embodiment the gate-source capacitance 91 and the gate-drain capacitance 92, are for a given gate charging current. In a corresponding manner, a transition of the component from the on state to the off state is effected all the more rapidly, the lower—for a given gate discharging current—the gate-source capacitance 91 and the gate-drain capacitance 92 of the component.

Figure 4:
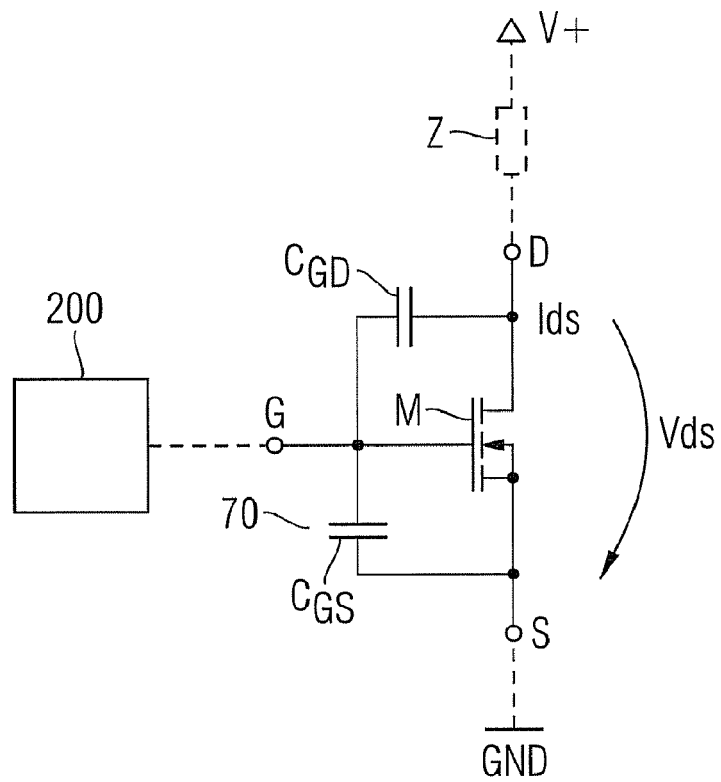
FIG. 4 illustrates one embodiment of an electrical equivalent circuit diagram of a transistor component in accordance with FIG. 1.
Figure 6:
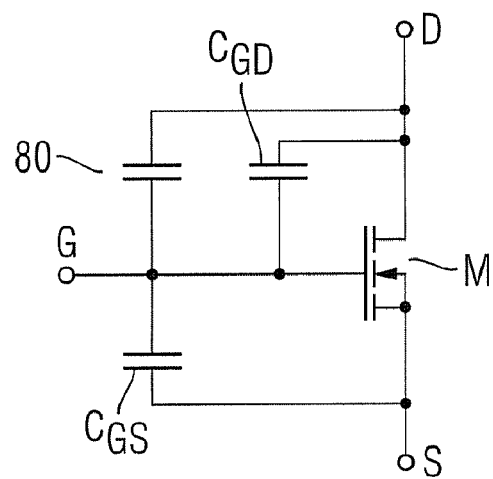
FIG. 6 illustrates one embodiment of an electrical equivalent circuit diagram of a transistor component in accordance with FIG. 5.

Although very small gate-source and gate-drain capacitances, and hence rapid transitions of the component from the off state to the on state, and vice versa, are often desirable in principle since they yield low switching losses, they are problematic for example, when the component serves for example, for switching an inductive load, or load exhibiting an inductance, without a sufficient freewheeling element or a sufficient freewheeling current branch being present. Referring to FIG. 6, which illustrates the transistor component illustrated in FIG. 1 on the basis of its electrical circuit symbol, the load path or drain-source path DS of the transistor component is in this case connected in series with a load Z between terminals for supply potentials V+, GND. In this case, the reference symbol Z in FIG. 4 designates a load Z which, in one embodiment, is an inductive or at least inductance-loaded load. In the Figure the component bearing the reference symbol Z represents the actual load that is intended to be driven or switched, and also parasitic inductances, such as e.g., inductances of the leads to the load. The reference symbol 200 in FIG. 4 designates the above-explained drive circuit which is connected to the gate connection G and which serves for driving the component in the on state and in the off state.

A small gate-source capacitance, which brings about rapid switching of the component, and which therefore leads during the switching operations to steep edges of a load current Ids flowing through the component between drain D and source S and of a load path voltage Vds present between drain and source D, S is problematic particularly when switching inductive loads, or loads exhibiting an inductance, if a sufficient freewheeling current branch is not present. Steep switching edges of the load current Ids, that is to say rapid changes dIds/dt in the load current Ids over time, can lead to high voltage spikes in the voltages present across the load Z or across other circuit parts and the switching element M. Furthermore, in the case of a small gate-source capacitance, electromagnetic pulses that act on the gate connection G may already suffice, under certain circumstances, to change the switching state of the component at least for a short time.

Another particularly critical application in which steep switching edges can occur is present when there is a strong coupling between load current paths and driving paths or small signal current paths in the circuit. In this case, load current paths are those current paths which include the load Z and the load path D-S of the MOS transistor M, and driving paths are those paths which lead to the drive connection (gate connection) G of the MOS transistor. Such a strong coupling can be formed for example, by a high coupling capacitance or a high coupling inductance in the case of adjacent line routing of the lines for load current paths and driving paths. Such a strong coupling can also be a resistive coupling present when an interconnect is used jointly for load current and control current. These couplings lead to reactions which, particularly in the case of very steep switching edges, can lead to the excitation of oscillations or to other interference signals and malfunctions. An optimization of the interconnect routing in order to reduce the susceptibility of the circuit to interference in the case of steep switching edges is in some cases not possible or not desirable owing to the higher outlay.

In the transistor component illustrated in FIG. 1, a first capacitive component 70 is provided, which is connected between the gate electrode 41 and the source zone 14 or the source electrode 16. In the example illustrated, the capacitive component 70 is integrated in the semiconductor body in the region of the drift control zone 21 and has a first electrode 73, with which contact is made by the source electrode 16 and which is therefore electrically conductively connected to the source zone 14. The capacitive component 70 additionally has a second connection electrode 71, which is electrically conductively connected to the gate electrode 41. The electrically conductive connection between the second connection electrode 71 and the gate electrode 41 is only illustrated schematically in FIG. 1. An example of the realization of such an electrically conductive connection will also be explained below with reference to FIG. 5. The capacitive component 70 illustrated in FIG. 1 is realized as a trench capacitor. In this case, the first connection electrode 73 extends into the semiconductor body 100 in sections in a vertical direction proceeding from the front side 101 in such a way that an interspace is formed between two sections of the first connection electrode 73 which are spaced apart in a lateral direction. The second connection electrodes 71 is arranged in the interspace, and is dielectrically insulated from the first connection electrode 73 by a dielectric layer 72, for example, an oxide. The capacitive component 70 illustrated in FIG. 1 has a plurality of trench capacitor structures which are connected in parallel with one another by virtue of the fact that they have a common first connection electrode 73 and their second connection electrodes 71 are jointly connected to the gate electrode 41.

A first capacitive component 70 can be integrated in the semiconductor body 100 in the region of each of the drift control zones 21, as is illustrated in FIG. 1. Furthermore, there is also the possibility of integrating such capacitive first components 70 in the region of only some drift control zones 21 of the transistor component. In this case, the number of first capacitive components 70 to be integrated and their desired total capacitance are dependent on the desired total gate-source capacitance, and thus on the desired switching behavior of the component, and can be realized, using the measures described above, in a simple manner and without additional process-technological outlay by way of masks. It goes without saying that the total number of trench capacitor structures can deviate significantly from the two trench capacitor structures illustrated in FIG. 1. In this component, the total gate-source capacitance is formed by the above-explained inherently present gate-source capacitance formed by the gate electrode 41, the source zone 14 and sections of the gate dielectric 42, and also the at least one first capacitive component 70 connected in parallel with the gate-source capacitance.

The first and second connection electrodes 73, 71 of the first capacitive component 70 can be composed of any electrically conductive material, in one embodiment a material which is compatible with production processes in semiconductor technology. These two connection electrodes 73, 71 can be composed for example, of a doped polycrystalline semiconductor material, such as, e.g., silicon. Any method processes which are known in principle and suitable for producing trench capacitors are suitable for producing the capacitive component 70, such that detailed explanations in this respect can be dispensed with. Method processes in accordance with one embodiment of a production method are outlined only briefly below for reasons of completeness:

In such a method, trenches are produced in the semiconductor body 100 for example, proceeding from the front side 101. Areas of the semiconductor body 100 which are uncovered after the production of the trenches in the region of the drift control zone 21 or the connection zone 24 thereof are then provided with a dielectric layer 74, which serves for electrically insulating the later first connection electrode 73 from the drift zone 21 or the connection zone 24 thereof. The dielectric layer 74 is produced for example, by deposition of a dielectric such as an oxide, for example, or by a thermal oxidation or a combination of at least one deposition process and at least one thermal oxidation. An electrode layer 73 is subsequently deposited on the dielectric layer 74 in the trenches and above the front side 101, the electrode layer forming the later first connection electrode 73. Uncovered surfaces of the electrode layer 73 are subsequently covered with a dielectric layer 72, which forms the dielectric of the later capacitive component 70. The dielectric layer 72 can be produced like the dielectric layer 74 described above. A second electrode layer is subsequently deposited, which forms the later second connection electrodes 71 of the capacitive component 70. The electrode layer and the dielectric layer deposited before the deposition of the electrode layer 71 can finally be removed to the level of the electrode layer 73 deposited first—for example, by using an etching back process, which results in the structure having a connection electrode 73 and a plurality of second connection electrodes 70 as illustrated in FIG. 1.

Figure 3:
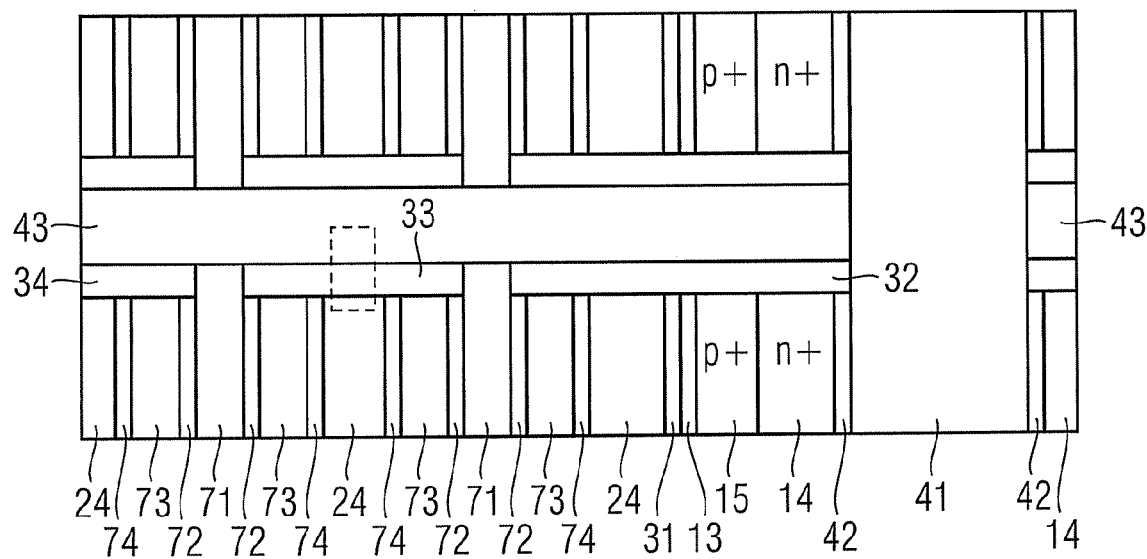
FIG. 3 illustrates one embodiment of a possibility for realizing an electrically conductive connection between the gate electrode and the first capacitive component.

FIG. 3 illustrates, on the basis of a cross section in the lateral sectional plane A-A, an example of how a connection of the electrode 41 to the second connection electrodes 71 can be realized. The transistor cells are realized as strip cells in this example. In this case, the source and body zones 14, 13 and also the connection electrodes 71, 73 and the dielectric 72 of the capacitive component 70 extend in elongated fashion in a lateral direction of the semiconductor body. In order to connect the second connection electrodes 71 to the gate electrode 41, a connecting electrode 43 is present, which runs in a trench transversely with respect to the longitudinal extension direction of the transistor cells and which is electrically conductively connected to the gate electrode 41 and to the second connection electrodes 71, and which is electrically insulated from the remaining component zones and the first connection electrode 73.

Apart from the gate-source capacitance, the gate-drain capacitance of the transistor component also influences the switching behavior of the component. For elucidation purposes, FIG. 4 likewise illustrates the circuit symbol of the gate-drain capacitance $C_{GD}$ in the electrical equivalent circuit diagram of the transistor component. In the case of a statically blocking transistor M, a voltage corresponding to the difference between an upper supply potential V+ and the gate potential is present across the gate-drain capacitance $C_{GD}$. If the transistor M starts to conduct when it is driven in the on state, then the drain-source voltage Vds of the component—which corresponds to the voltage difference between upper and lower supply potential V+, GND when the component is turned off—starts to decrease. The gate-drain capacitance $C_{GD}$ is discharged as the drain-source voltage Vds decreases. The discharging current required for this retards further charging of the gate-source capacitance $C_{GS}$, thus retards the more intense formation of the inversion channel in the body zone along the gate dielectric 42, and thus delays the transition of the component to the fully on state. This effect, which is also referred to as the Miller effect, is all the more pronounced, the higher the gate-drain capacitance $C_{GD}$. The switching speed of a transistor component is therefore all the lower, the higher the gate-drain capacitance of the component, or the switching edges of the drain-source voltage Vds are all the flatter, the higher the gate-drain capacitance.

Figure 5:
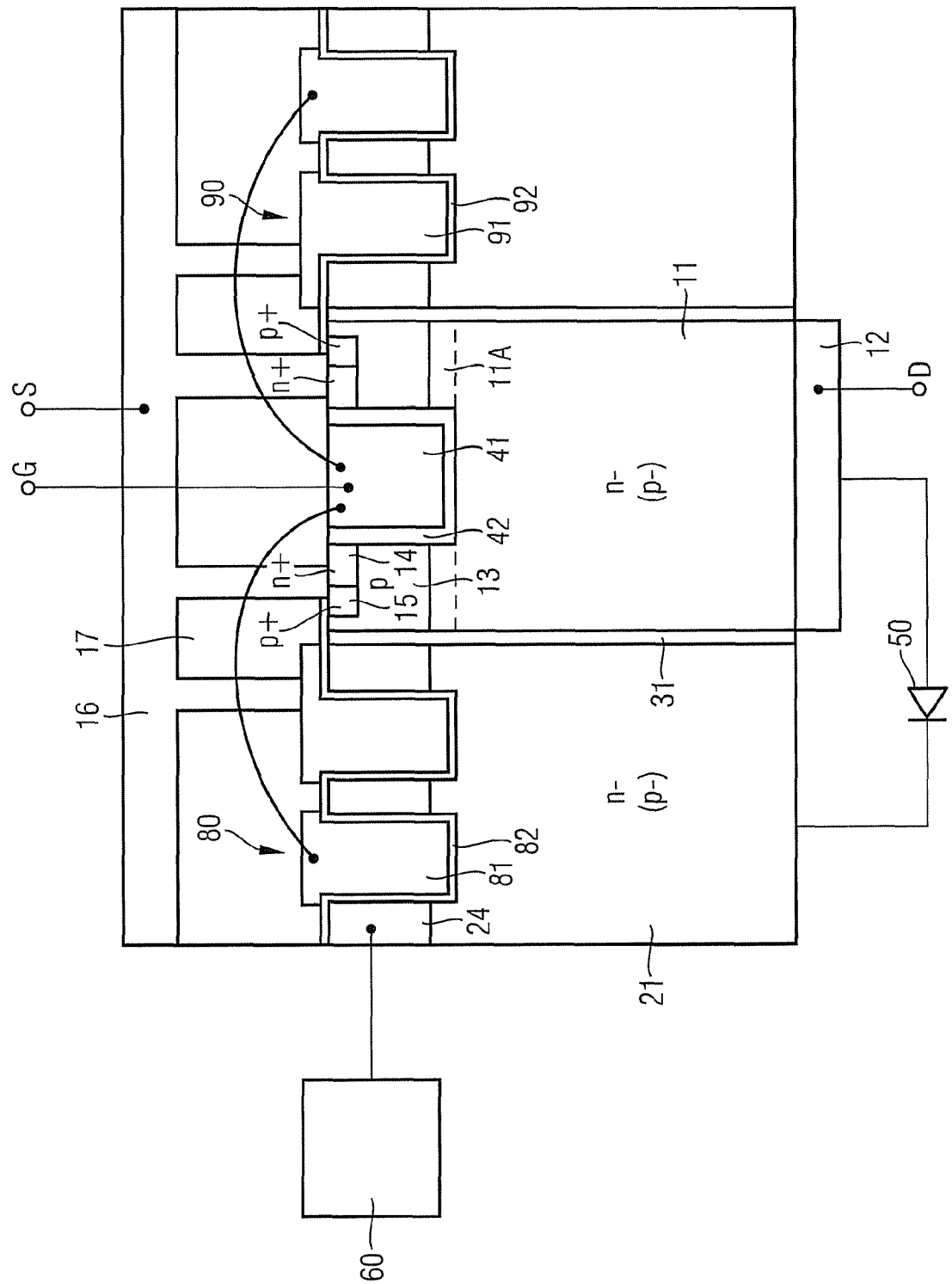
FIG. 5 illustrates, on the basis of a cross-sectional illustration, one embodiment of a transistor component including a drift zone and a drift control zone and a second capacitive component, which is connected between a gate electrode and a drain zone.

Referring to FIG. 5, if appropriate undesirably high switching edges can be combated by providing a second capacitive component 80, which is connected in parallel with the gate-drain capacitance $C_{GD}$. In one embodiment illustrated, the second capacitive component 80 is connected between the gate electrode 41 and the drift control zone 21. This makes use of the fact that when the component is turned off, that is to say when the gate-drain capacitance is particularly effective with regard to influencing the steep profile of the switching edges, the drift control zone 21 is connected to drain potential via the rectifier element 50, which is forward-biased when the component is turned off. The second capacitive component 80 has a first and a second electrode, which are dielectrically insulated from one another by a dielectric 82. In the example illustrated, the first electrode is formed by the drift control zone 21 and the connection zone 24 thereof. The second connection electrode 81 can be composed of any electrically conductive material such as, for example, a metal or a polycrystalline semiconductor material. The second connection electrode 81 is connected to the gate electrode 41, which is only illustrated schematically in FIG. 5. The second connection electrode 81 can be connected to the gate electrode 41 in the same way as the second electrode 71 of the first capacitive component 70 is connected to the gate electrode 41, which was explained with reference to FIG. 3.

The second capacitive component 80 can be realized as a trench capacitor—in a manner corresponding to the first capacitive component 70. Such a trench capacitor is produced for example, by a trench being etched into the semiconductor body proceeding from the front side 101. A dielectric layer that forms the later capacitor dielectric 82 is subsequently produced on uncovered surfaces of the semiconductor body in the trench and outside the trench. The trench is subsequently filled with an electrode material that forms the later second connection electrode 81.

In a manner corresponding to the first capacitive component 70, a second capacitive component 80 can be integrated in the semiconductor body 100 in the region of each of the drift control zones 21, as is illustrated in FIG. 5. Furthermore, there is also the possibility of integrating such capacitive second components 80 in the region of only some drift control zones 21 or a plurality of second capacitive components 80 in some or all drift control zones 21 of the transistor component. In this case, the number of second capacitive components to be integrated and their desired total capacitance are dependent on the desired total gate-drain capacitance, and thus on the desired switching behavior of the transistor component. The total gate-drain capacitance of the component is formed by the above-explained inherently present gate-drain capacitance and the at least one second capacitive component 80 connected in parallel with the gate-drain capacitance.

Alongside the first capacitive components 70 and the second capacitive components 80, referring to FIG. 5, further capacitive components 90 can be integrated in the drift control zone 21 and are present between the drift control zone 21 and the source connection S or the source zone 14. In the example illustrated, the capacitive components 90 have an electrode 91 connected to the source zone 14 and a dielectric present between the electrode 91 and the drift control zone 21. The further capacitive components serve, during operation of the component, to buffer-store electrical charge from the drift control zone 21 when the component is turned off, the charge being required in the drift control zone 21 when the component is driven in the on state in order to form a conducting channel in the drift zone 11 along the drift control zone dielectric 31. These capacitances can form part of the charging circuit 60.

In the component in accordance with FIG. 1, such additional capacitive components 90 are formed by the first connection electrodes 73 connected to the source electrode 16 or the source zones 14, and the dielectric layer 74 present between the first connection electrodes 73 and the drift control zone 21. In the component in accordance with FIG. 1, therefore, two capacitive components are formed by the first and second connection electrodes 71, 73 and the first and second dielectrics 72, 74: a first capacitive component between gate G and source S; and a second capacitive component between source S and drift control zone 21. If the second capacitive component is intended to have a higher capacitance than the first capacitive component, there is the possibility of providing additional capacitive components in the semiconductor component in accordance with FIG. 1, such as were explained with reference to FIG. 5 and which are designated there by the reference symbol 90. Such components can be obtained in a simple manner by dispensing with the second electrode 71 and the first dielectric 72 in the structures explained with reference to the Figure. In a further example (not illustrated in more specific detail) it is provided that a plurality of the structures having first and second connection electrodes 71, 73 and first and second dielectrics 72, 74 as explained with reference to FIG. 1 are provided in a semiconductor component, but the first and second connection electrodes 71, 73 are short-circuited in some of these structures and no electrically conductive connection between the second connection electrode 71 and the gate electrode 41 is provided in these structures. These last-mentioned structures having short-circuited first and second connection electrodes 71, 73 then form exclusively capacitive components between the source zone 14 and the drift control zone 21 while the remaining structures without such short circuits form the two capacitive components mentioned above. In this case, the ratio between the capacitance of the first capacitive component and the capacitance of the second capacitive component can be set by way of the ratio between the number of structures with short circuits and the number of structures without short circuits.

FIG. 6 illustrates the electrical equivalent circuit diagram of the transistor component illustrated in FIG. 5. In this case, alongside the inherently present gate-drain capacitance, the second capacitive component 80 is connected between drain D and gate G of the transistor component.

Figure 7:
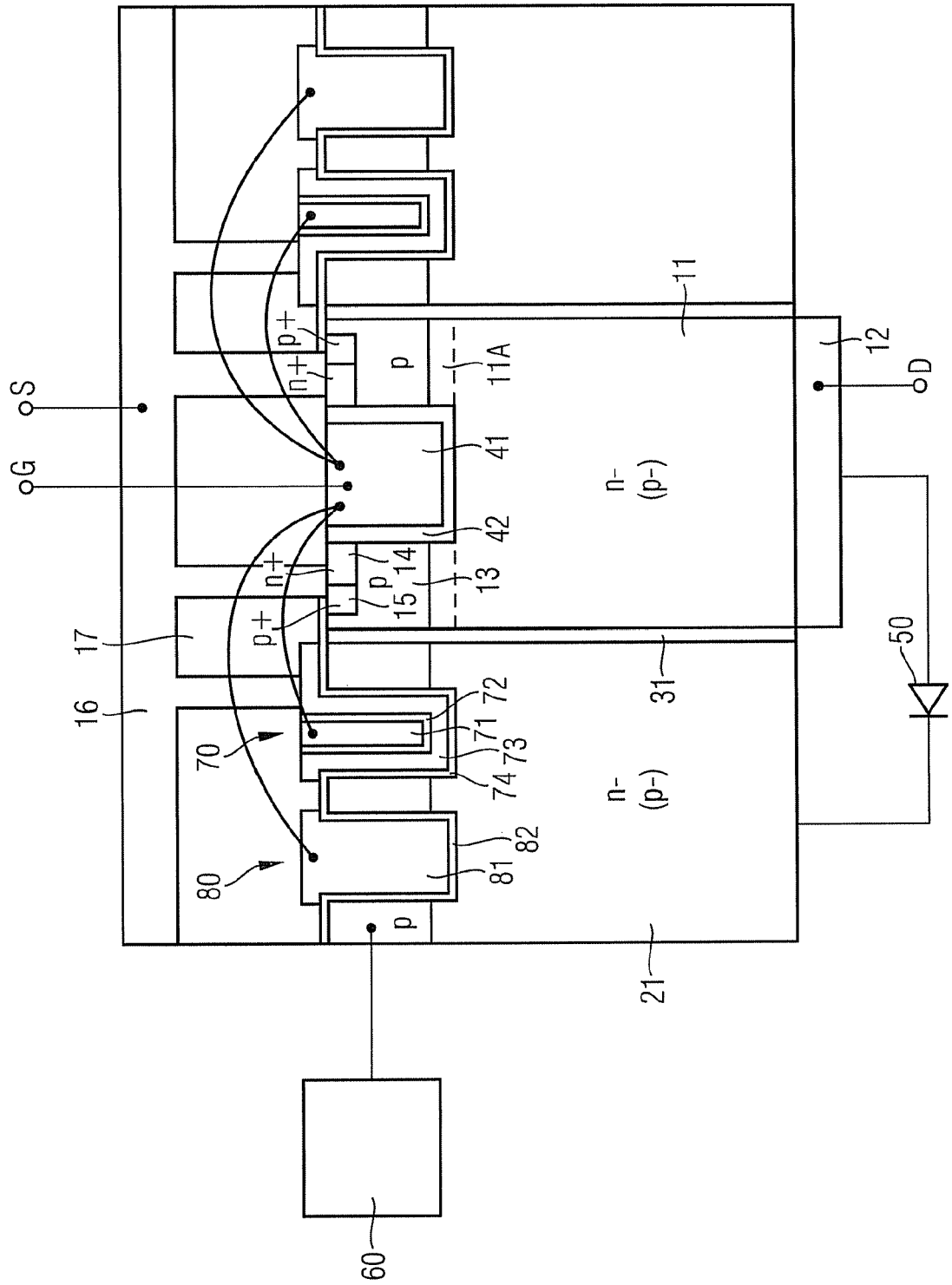
FIG. 7 illustrates, on the basis of a cross-sectional illustration, one embodiment of a transistor component including a first capacitive component, which is connected between the gate electrode and the source zone, and a second capacitive component, which is connected between the gate electrode and the drain zone.

Alongside the absolute values of the total gate-source capacitance and the total gate-drain capacitance, the ratio of total gate-drain capacitance to total gate-source capacitance also determines the switching behavior of the component. In order to tune this ratio of total gate-drain capacitance to total gate-source capacitance, there is also the possibility, of course, referring to FIG. 7, of integrating both first capacitive components 70 and second capacitive components 80 in the transistor component.

Figure 8:
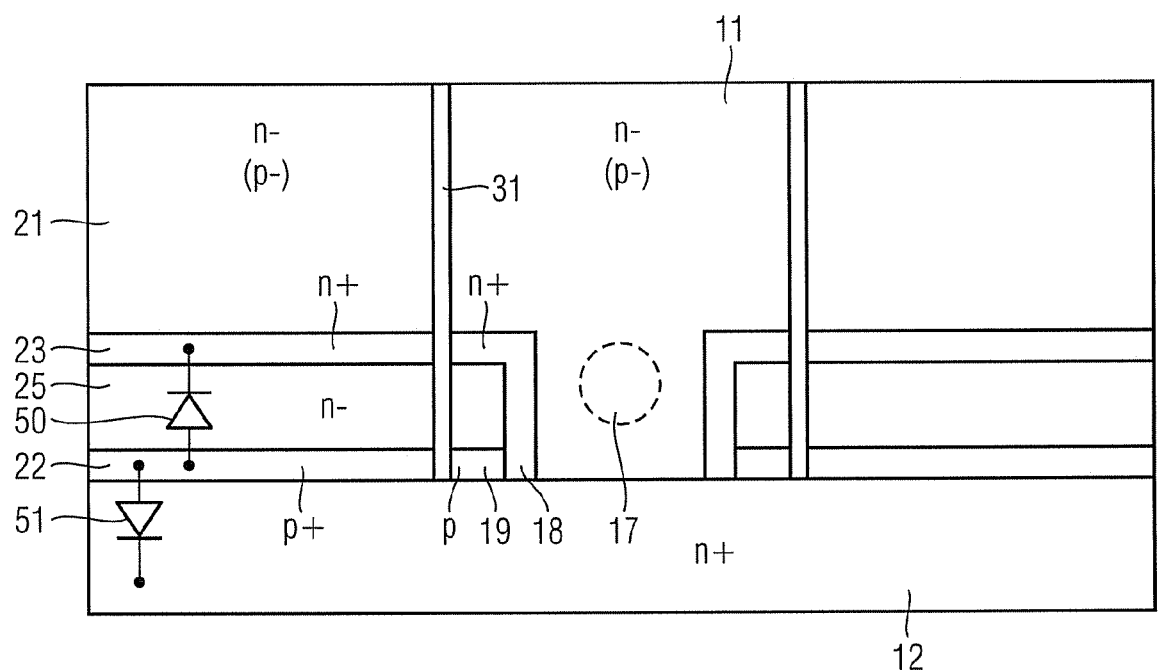
FIG. 8 illustrates one embodiment of a possibility for realizing a coupling of the drift control zone to the drain zone.

FIG. 8 illustrates a possible realization of the rectifier element 50 on the basis of an excerpt from the semiconductor component. In this example, the drain zone 12 extends over the entire rear side 102 of the semiconductor body 100. The drain zone 12 can be realized for example, as a highly doped semiconductor substrate to which the other component zones explained above, in one embodiment the drift zone 11 and the drift control zone 21, are applied by epitaxy methods. Between the drain zone 12 and the drift control zone 21 there are two semiconductor zones 22, 23 doped complementarily to one another, a first semiconductor zone 23, which is directly adjacent to the drift control zone 21, and a second semiconductor zone 22, which is arranged between the first semiconductor zone 23 and the drain zone 12. A more lightly doped semiconductor zone 25 of the first or second conduction type can optionally be provided between the first and second semiconductor zones 22, 23.

The first semiconductor zone 23 is n-doped in one embodiment illustrated, and the second semiconductor zone 22 is p-doped in the embodiment. These two semiconductor zones with the pn junction formed between them jointly form the rectifier element 50, the circuit symbol of which is likewise illustrated in FIG. 8 for the sake of better understanding. A rectifier element 51 is likewise formed between the second semiconductor zone 22 and the drain zone 12, but the rectifier element has a very low blocking capability in the region of at most a few volts on account of the high dopings of the second semiconductor zone 22 and the drain zone 12. At reverse voltages of a few hundred volts, the voltage drop across the rectifier element 51 is negligible, such that it can be assumed in the off-state case that the drift control zone 21 is at drain potential at its end facing the rear side 102.

In the on-state case of the component, a highly conductive channel is formed in the drift zone 11 along the accumulation dielectric 31 in a vertical direction, which channel reduces the on resistance of the component in comparison with components without such a drift control zone 21. However, the accumulation channel extends—when the first rectifier element 50 is integrated in the semiconductor body 100—in a vertical direction of the semiconductor body 100 only to approximately the level of the first semiconductor zone 23 adjacent to the drift control zone 21. In order to prevent an increased on resistance from resulting from this, a connecting zone 18 doped more highly than the drift zone 11 is provided, which connecting zone is adjacent to the drift control zone dielectric 31 and extends in the drift zone 11 as far as the drain zone 12. In a vertical direction, the connection zone 18 begins at the level of the first semiconductor zone 23 or—proceeding from the drain zone 12—actually above the first semiconductor zone 23. A doping type of the connecting zone corresponds to a doping type of the drain zone 12.

The connecting zone can extend over the entire width of the drift zone in a lateral direction, but can also be realized—as illustrated in FIG. 8—in such a way that it extends parallel to sections of the drift zone 11 as far as the drain zone 12.

One embodiment of a method for producing the semiconductor structure with the integrated rectifier element 50 and the connecting zone as illustrated in FIG. 8 is explained briefly below:

One starting point of a method is formed by providing a semiconductor substrate that forms the later drain zone 12. Afterward, the substrate has applied to it over the whole area successively a first semiconductor layer of the conduction type of the second semiconductor zone 22 and a semiconductor layer of the conduction type of the more lightly doped semiconductor zone 25. As an alternative, the semiconductor zone 25 can also be embodied with a lighter doping of the conduction type of the semiconductor zone 22. In the region of the later drift zone 11, a trench-type cutout is then produced in these semiconductor layers, which cutout reaches as far as or right into the semiconductor substrate that forms the drain zone 12. At the surface of the semiconductor structure thus produced, a semiconductor zone of the conduction type of the later first semiconductor zone 23 and of the later connecting zone 18 is then produced. In this case, the doping should be high enough that it exceeds the doping of the first semiconductor layer, which forms the zone 22, second semiconductor zone 22. Such dopings can be introduced into the semiconductor structure e.g., from the gas phase or from highly doped glasses deposited on the semiconductor structure. After the semiconductor surface has been cleaned, the semiconductor region that later forms the drift zone 11 and the drift control zone 21 can then be deposited epitaxially. In this case, a void 17 can remain in the region of the drift zone 11, which void can arise as a result of incomplete growth of the epitaxy in the region of the drift zone 11. If the accumulation dielectric 31 is then produced by using a deep etching process with a subsequent growth or filling process, then a structure as illustrated in FIG. 8 arises. In this case, the semiconductor zone designated by 19 represents the residue—separated by the accumulation dielectric 31—of the first semiconductor layer, which forms the second semiconductor zone 22 in the region of the drift control zone. The connecting zone 18, which produces the electrical connection of the accumulation channel to the drain zone 12, and the first semiconductor zone 23 are originally a common zone that is separated later by the drift control zone dielectric 31.

The structure with an integrated diode as explained with reference to FIG. 8 can be used in any of the components illustrated in the other Figures.

Figure 9:
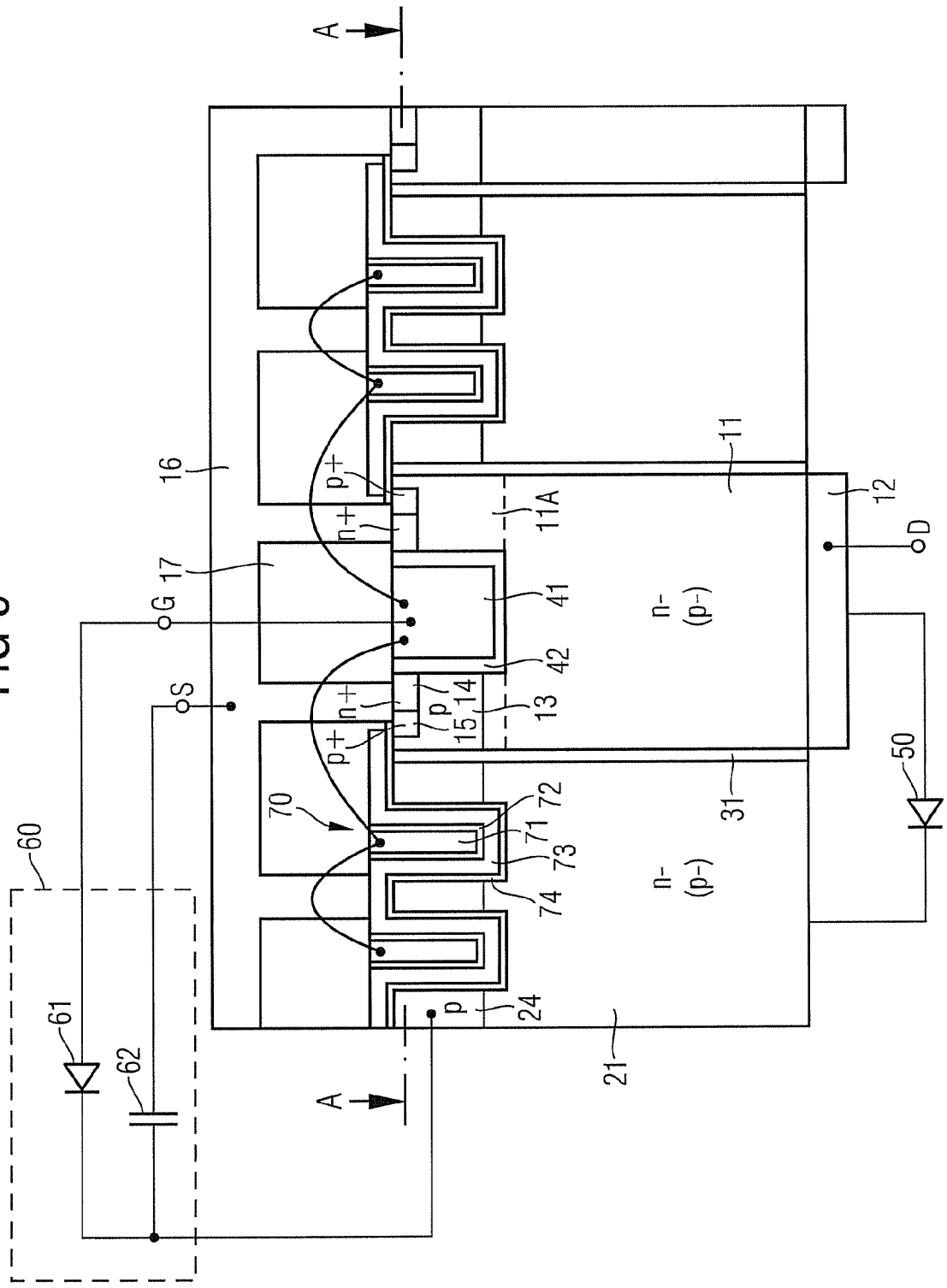
FIG. 9 illustrates a first example of a charging circuit connected to the drift control zone.

A first example of a charging circuit 60 is illustrated in detail in FIG. 9. This charging circuit 60 has a first rectifier element 61, for example, a diode, which is connected between the gate connection G and the connection zone 24 of the drift control zone 21. In this charging circuit, charging of the drift control zone 21 to an electrical potential that is higher than in the drift zone 11 takes place from the gate circuit or by using a drive circuit (not illustrated) connected to the gate connection G. The charging circuit 60 additionally includes a storage capacitance 62, which is connected between the source connection S and the connection zone 24 of the drift control zone 21 in the example illustrated. The storage capacitance 62 serves to store electrical charge that flows away from the drift control zone 21 when the component is driven in the off state on account of the space charge zone propagating in the drift control zone 21. In the case of the n-channel MOSFET illustrated, the charge carriers are positive charge carriers, that is to say holes.

As an alternative or in addition to an external storage capacitance 62, it is possible to integrate storage capacitances e.g., having the connection electrodes 73 and the dielectric 74 in the drift control zone 21 in the semiconductor body.

In a manner not illustrated more specifically, it is possible to provide a single charging circuit for all the drift control zones of the semiconductor component. Furthermore, there is also the possibility of providing a plurality of charging circuits which are in each case assigned to the drift control zones of a group of transistor cells.

Figure 10:
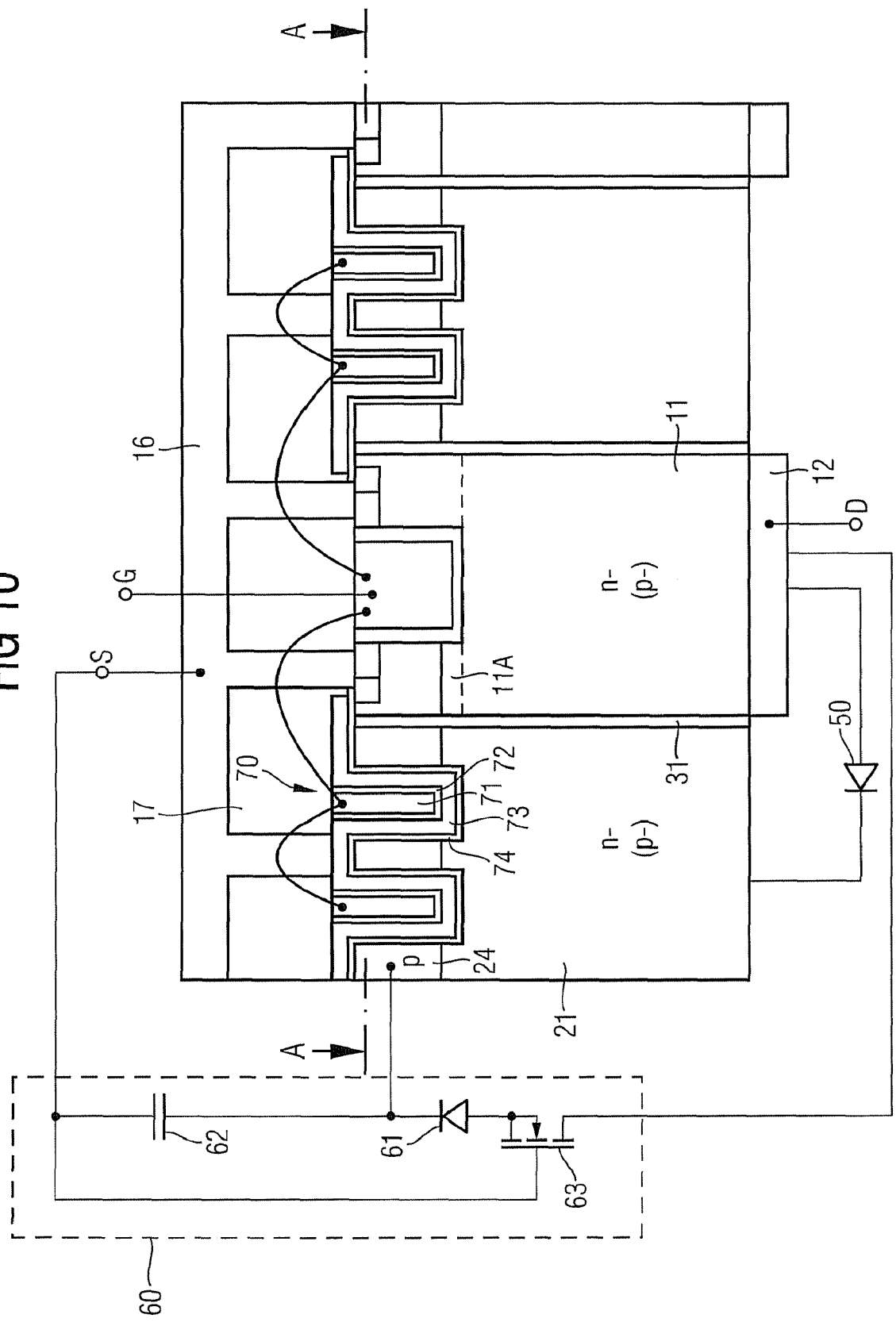
FIG. 10 illustrates a second example of a charging circuit connected to the drift control zone.

FIG. 10 illustrates a further example of the charging circuit 60. This charging circuit has a capacitive storage element 62 connected between the source connection S and the connection zone 24 of the drift control zone 21. A diode 61 is present for charging the capacitive storage element 62, the diode being connected between the drain zone 12 or the drain connection D and that connection of the capacitive storage element 62 which is remote from the source connection S. In this component, the capacitive storage element 62 is charged via the diode 61 in each case when the component is turned off. As a result, the capacitive storage element 62 stores electrical charge which is required for charging the drift control zone when the component is subsequently switched on again. In order to upwardly limit a charging of the capacitive storage element 62, a normally on transistor is present, the load path of which is connected in series with the diode 61 and the control connection of which is at source potential. The transistor is turned off if a voltage across the series circuit with the diode 61 and the charge storage element 62 reaches the value of its pinch-off voltage. In this way, the maximum voltage drop across the charge storage element 62 and thus the maximum charging of the charge storage element can be set by using the pinch-off voltage of the transistor 62. The charge store 62 can in turn be integrated wholly or partly in the semiconductor body.

In the case of the semiconductor component arrangements explained above, the transistor cells of the semiconductor component are realized as trench transistor cells. It goes without saying that the concept explained above, which provides additional first and second capacitive components 70, 80, is not restricted to the use of such trench transistor cells. Thus, referring to FIG. 11, there is for example, also the possibility of realizing planar transistor cells. In this case, the gate electrode 41 is arranged above the front side 101 of the semiconductor body. An inversion channel controlled by the gate electrode 41 forms in a lateral direction of the semiconductor body in this component. For reasons of clarity, the additional first and/or second capacitive components are not illustrated in FIG. 11 nor in FIG. 12, which will also be explained below.

Figure 12:
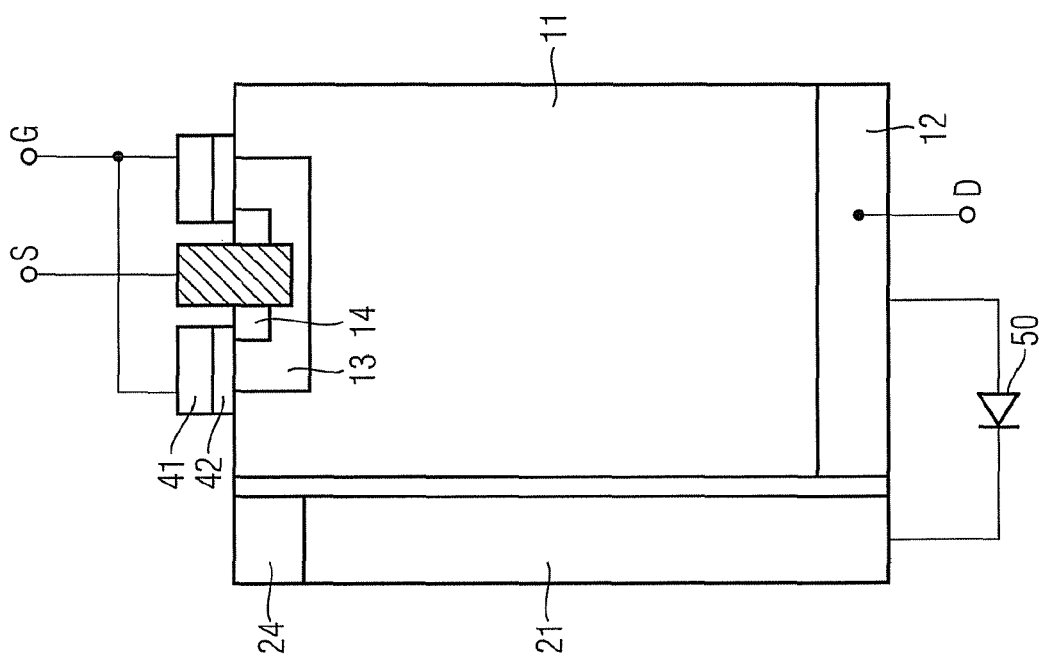
FIG. 12 schematically illustrates one embodiment of a transistor component realized as a trench transistor component.

It was assumed for the explanations above that the transistor structure of the component explained is a structure of an n-channel MOSFET. The source zone 14 and the drain zone 12 of such an n-conducting MOSFET are n-doped, and the body zone 13 is p-doped. In this component, the gate electrode 41 serves for controlling an inversion channel in the body zone 13 between the source zone 14 and the drift zone 11. In the components explained above, the drift zone 11 is likewise n-doped. In the drift zone, under the control of the electrical potential of the drift control zone 21, an accumulation channel propagates along the dielectric layer 31. For this purpose, the drift control zone 21 can be either n-doped or p-doped. In a departure from the explanation above, the drift zone 11 can also be completely or partly p-doped. In this case, when the component is driven in the on state, an inversion channel propagates in the drift zone 11 along the dielectric layer 31. In the case of an n-conducting component having a p-doped drift zone 11, however, it is necessary to take measures which ensure that when the component is driven in the on state there is an electrically conductive connection between the inversion channel in the body zone 13 and the inversion channel along the dielectric layer 31. FIG. 12 illustrates by way of example a component in which the channels are directly adjacent to one another. In this component, the gate electrode 41 is isolated from the body zone 13 by a gate dielectric 42 situated directly as an extension of the drift control zone dielectric 31. In this component, the drift control zone dielectric 31 and the gate dielectric 42 can be realized in one embodiment as a common dielectric layer. The inversion channel controlled by the gate electrode 41 in the body zone 13 and the accumulation channel (in the case of an n-doped drift zone 11) controlled by the drift control zone 21 along the drift control zone dielectric 31 or inversion channel (in the case of a p-doped drift zone 11) are directly adjacent to one another in this component.

In the components explained with reference to FIGS. 1 and 9, the drift zone 11 could be p-doped in the lower region of the component and n-doped in the upper region. In this case, the n-doped region of the drift zone 11 ensures a connection between the inversion channel that forms in the body zone 13 and the inversion channel that forms along the p-doped drift zone section. The reference symbol 11A in FIGS. 1, 5, 7, 9 and 10 designates such drift zone sections which should be n-doped when using a drift zone that is p-doped in the lower region of the component.

Finally, it should be pointed out that method or component features which have been explained only in connection with one example can be combined with method or component features from other examples even when this has not been explicitly explained previously. Thus, in one embodiment, features that are represented in one of the following claims can be combined with features of any other claims.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A transistor component comprising:
a drift zone;
a body zone;
a source zone; and
a drain zone, wherein the drift zone is arranged between the body zone and the drain zone and the body zone is arranged between the source zone and the drift zone;
a gate electrode, dielectrically insulated from the body zone by a gate dielectric;
a gate-source capacitance, formed between the gate electrode and the source zone;
a gate-drain capacitance, formed between the gate electrode and the drain zone; and
a drift control zone, arranged adjacent to the drift zone and dielectrically insulated from the drift zone by a drift control zone dielectric;
comprising at least one of the following:
at least one first capacitive component connected between the gate electrode and the source zone in addition to the gate-source capacitance;
at least one second capacitive component connected between the gate electrode and the drain zone in addition to the gate-drain capacitance,
wherein the drift zone, the body zone, the drain zone and the source zone and also the at least one first or second capacitive component are integrated in a common semiconductor body,
wherein the first or second capacitive component is integrated at least in sections in the drift control zone or in a manner adjoining the drift control zone in the semiconductor body,
wherein the drift control zone is coupled to the drain zone, and
wherein the at least one second capacitive component comprises:
a first electrode, connected to the gate electrode; and
a second dielectric, arranged between the first electrode and the drift control zone.

2. The transistor component of claim 1, wherein the first or second capacitive component is integrated at a distance from the gate electrode in the semiconductor body.

3. The transistor component of claim 1, wherein the at least one first capacitive component comprises:
a first electrode, connected to the gate electrode;
a second electrode, connected to the source zone and insulated from the drift control zone; and
a first dielectric arranged between the first electrode and the second electrode.

4. The transistor component of claim 1, wherein the drift control zone is coupled to the drain zone via a rectifier element.

5. The transistor component of claim 1, comprising a charging circuit connected to the drift control zone, wherein the charging circuit comprises:
a rectifier element, connected between the gate electrode and the drift control zone; and
a further capacitive component, connected between the drift control zone and the source zone,
wherein the charging circuit comprises:
a rectifier element, connected between the drain zone and the drift control zone; and
a further capacitive component, connected between the drift control zone and the source zone.

* * * * *